United States Patent
Kondo et al.

(10) Patent No.: US 10,035,912 B2
(45) Date of Patent: *Jul. 31, 2018

(54) FLAME RETARDANT RESIN COMPOSITION, FLAME RETARDANT RESIN FILM, SEMICONDUCTOR DEVICE, AND MAKING METHOD

(71) Applicant: Shin-Etsu Chemical Co., Ltd., Tokyo (JP)

(72) Inventors: Kazunori Kondo, Annaka (JP); Yoichiro Ichioka, Annaka (JP)

(73) Assignee: SHIN-ETSU CHEMICAL CO., LTD., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/342,479

(22) Filed: Nov. 3, 2016

(65) Prior Publication Data
US 2017/0121526 A1    May 4, 2017

(30) Foreign Application Priority Data

Nov. 4, 2015 (JP) ................................. 2015-216560

(51) Int. Cl.
| | |
|---|---|
| C08L 83/06 | (2006.01) |
| C08L 61/14 | (2006.01) |
| C08G 77/48 | (2006.01) |
| H01L 21/56 | (2006.01) |
| H01L 21/78 | (2006.01) |
| H01L 23/00 | (2006.01) |
| C08G 77/52 | (2006.01) |
| C08G 59/24 | (2006.01) |
| C08K 3/36 | (2006.01) |
| C09D 163/00 | (2006.01) |
| C09D 183/14 | (2006.01) |
| C08G 77/14 | (2006.01) |
| C08L 63/00 | (2006.01) |
| C08L 83/14 | (2006.01) |
| H01L 23/29 | (2006.01) |

(52) U.S. Cl.
CPC .............. *C08L 83/06* (2013.01); *C08G 59/24* (2013.01); *C08G 77/14* (2013.01); *C08G 77/485* (2013.01); *C08G 77/52* (2013.01); *C08K 3/36* (2013.01); *C08L 63/00* (2013.01); *C08L 83/14* (2013.01); *C09D 163/00* (2013.01); *C09D 183/14* (2013.01); *H01L 21/56* (2013.01); *H01L 21/78* (2013.01); *H01L 23/296* (2013.01); *H01L 23/562* (2013.01); *C08L 2201/02* (2013.01); *C08L 2203/16* (2013.01); *C08L 2203/206* (2013.01); *C08L 2205/03* (2013.01)

(58) Field of Classification Search
None
See application file for complete search history.

(56) References Cited

U.S. PATENT DOCUMENTS

| | | | | |
|---|---|---|---|---|
| 5,952,447 A * | 9/1999 | Ikeda | ..................... | C08G 14/10 525/489 |
| 6,133,377 A * | 10/2000 | Nakamura | .............. | C08L 61/34 428/413 |
| 8,481,244 B2 * | 7/2013 | Takeda | ..................... | C08L 83/06 430/18 |
| 9,447,305 B2 * | 9/2016 | Kondo | ..................... | C08G 77/52 |
| 2003/0152776 A1 | 8/2003 | Kiuchi et al. | | |
| 2004/0212030 A1 * | 10/2004 | Asai | ..................... | G02B 6/12002 257/432 |
| 2006/0263003 A1 * | 11/2006 | Asai | ..................... | G02B 6/4204 385/14 |
| 2011/0105646 A1 | 5/2011 | Kan et al. | | |
| 2012/0108762 A1 * | 5/2012 | Kondo | ..................... | C08G 77/14 525/476 |
| 2017/0320994 A1 * | 11/2017 | Arita | ..................... | C08G 14/10 |

FOREIGN PATENT DOCUMENTS

| | | |
|---|---|---|
| EP | 2 910 587 A1 | 8/2015 |
| WO | 2009/142065 A1 | 11/2009 |
| WO | 2015/111427 A1 | 7/2015 |
| WO | WO 2016/052290 A1 * | 4/2016 |

OTHER PUBLICATIONS

Extended European Search Report dated Feb. 28, 2017, issued in counterpart European Application No. 16196522.3. (8 pages).

* cited by examiner

*Primary Examiner* — Marc S Zimmer
(74) *Attorney, Agent, or Firm* — Westerman, Hattori, Daniels & Adrian, LLP

(57) ABSTRACT

A flame retardant resin composition comprising (A) a silicone resin, (B) a triazine-modified phenol novolak compound, and (C) a filler can be formed in film form. The resin film possesses satisfactory covering or encapsulating performance to large size/thin wafers.

8 Claims, No Drawings

FLAME RETARDANT RESIN COMPOSITION, FLAME RETARDANT RESIN FILM, SEMICONDUCTOR DEVICE, AND MAKING METHOD

CROSS-REFERENCE TO RELATED APPLICATION

This non-provisional application claims priority under 35 U.S.C. § 119(a) on Patent Application No. 2015-216560 filed in Japan on Nov. 4, 2015, the entire contents of which are hereby incorporated by reference.

TECHNICAL FIELD

This invention relates to a flame retardant resin composition and flame retardant resin film as well as a semiconductor device and manufacturing method.

BACKGROUND ART

In the manufacture of microelectronic or semiconductor devices, a rapid progress is made toward wafers of larger diameter and reduced thickness. There is a need for the technique capable of encapsulating devices on the wafer level. While the technique for transfer molding solid epoxy resin compositions is conventional, a technique for compression molding liquid epoxy resin compositions is proposed in WO 2009/142065.

The transfer molding technique can cause wire deformation because the resin is flowed into narrow gaps. Short filling is more likely to occur as the encapsulation area becomes larger. The compression molding technique is difficult to precisely control the molding range at an end portion of the wafer. Also, it is not easy to optimize the flow and physical properties of the liquid encapsulating resin when it is fed into the molding machine. With the recent transition of wafers toward larger diameter and reduced thickness, the warpage of the wafer after molding, which is not noticeable in the prior art, becomes a problem. Also better wafer protection is required. It would be desirable to have a wafer molding material which can encapsulate an overall wafer at a time without raising problems including short filling at the wafer surface, and which exhibits minimal warpage and satisfactory wafer protection after molding.

Besides, since encapsulant compositions used with electric/electronic parts are flammable as such, flame retardant agents and additives such as halogen compounds and antimony compounds are added thereto to render them flame retardant. However, from the aspect of reducing the environmental load, the use of these compounds is now limited. Instead, phosphorus based flame retardants are used. The phosphorus based flame retardants, however, can have a negative impact on water quality. There is a need for a molding or encapsulating material free of phosphorus based flame retardant additives.

CITATION LIST

Patent Document 1: WO 2009/142065

DISCLOSURE OF INVENTION

An object of the invention is to provide a flame retardant resin composition or flame retardant resin film which is substantially free of flame retardant additives, can encapsulate an overall wafer at a time (i.e., wafer molding), is effectively moldable over a large-diameter/thin wafer, offers minimal warpage and satisfactory wafer protection after molding, ensures efficient molding process, and is thus suited for wafer-level packages. Another object is to provide a semiconductor device covered with the flame retardant resin film; and a method for manufacturing the semiconductor device.

In one aspect, the invention provides a flame retardant resin composition comprising (A) a silicone resin, (B) a triazine-modified phenol novolak compound, and (C) a filler. The silicone resin (A) is defined as comprising constituent units represented by the compositional formula (1) and having a weight average molecular weight of 3,000 to 500,000,

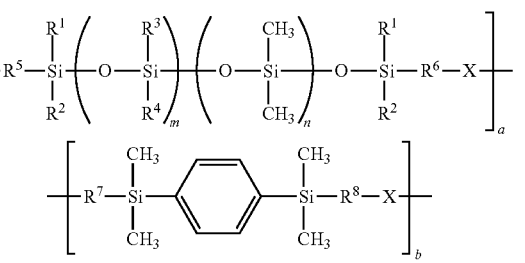

wherein $R^1$ to $R^4$ are each independently a monovalent $C_1$-$C_8$ hydrocarbon group, excluding that $R^3$ and $R^4$ are methyl at the same time, m and n each are an integer of 0 to 300, $R^5$ to $R^8$ are each independently a divalent $C_1$-$C_{10}$ hydrocarbon group, a and b are positive numbers, a+b=1, X is a divalent organic group having the general formula (2):

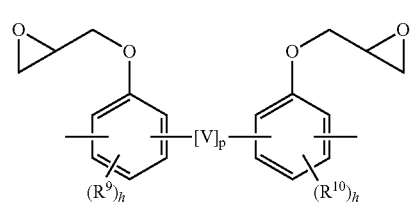

wherein V is a divalent organic group selected from the following:

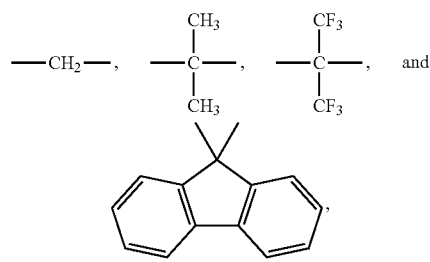

p is 0 or 1, $R^9$ and $R^{10}$ are each independently $C_1$-$C_4$ alkyl or alkoxy, and h is 0, 1 or 2.

Preferably, component (B) is an amino-containing triazine skeleton phenol novolak resin, specifically a triazine skeleton-bearing phenol novolak compound having the general formula (7):

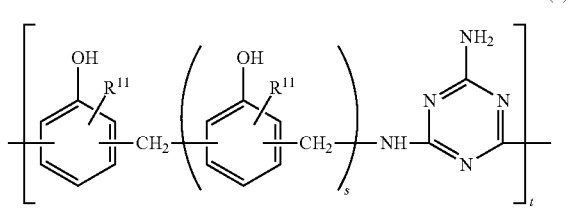

(7)

wherein $R^{11}$ is hydrogen or methyl, s is an integer of 1 to 10, and t is an integer of 1 to 5.

The flame retardant resin composition as defined above can be formed into a film, with which an overall wafer can be covered (obtaining molded wafer). For large diameter/thin wafers, the resin composition ensures satisfactory molding performance, adhesion, low warpage, wafer protection, reliability and flame retardance, and is thus useful in wafer-level packages.

In a preferred embodiment, the amount of component (B) is 5 to 50 parts by weight per 100 parts by weight of component (A), and the weight fraction of component (C) is 60 to 95% by weight, more preferably 70 to 90% by weight of the total weight of the composition.

This flame retardant resin composition can be readily formed into a film, with which an overall wafer can be readily covered (obtaining molded wafer). For large-diameter/thin wafers, the resin composition ensures satisfactory molding performance, adhesion, low warpage, wafer protection, reliability and flame retardance, and is thus fully useful in wafer-level packages.

Preferably an epoxy resin cure accelerator is further added to the resin composition for improving adhesion to wafer and wafer protection. The resin composition is fully useful in wafer-level packages. Further preferably, an epoxy resin is added to the resin composition for improving adhesion and protection.

Preferably silica is used as the filler. The use of silica filler is convenient because wafer protection is further improved, and better heat resistance, moisture resistance and strength are expected as well as higher reliability and flame retardance.

In a further aspect, the invention provides a flame retardant resin film formed from the flame retardant resin composition. The flame retardant resin film has good molding performance for large diameter/thin wafers. When an overall wafer is encapsulated in a batch, there is no need to cast the resin, eliminating problems like short-filling on the wafer surface. The film of the resin composition becomes a wafer molding material meeting both adhesion to wafer and wafer protection.

The flame resistant resin film may be prepared by the steps of coating the flame resistant resin composition onto a release or protective film to form a precursor including a resin composition layer, providing at least two such precursors, stripping the release or protective film from each precursor to bare the resin composition layer, and joining the bare resin composition layers to each other.

In a further aspect, the invention provides a method for manufacturing semiconductor devices, comprising the steps of attaching the flame retardant resin film to a semiconductor wafer to cover the wafer with the resin film, heat curing the resin film, and singulating the molded wafer into discrete devices.

The semiconductor wafer covered with the resin film (or molded wafer) experiences minimal warpage while it is fully protected. By singulating the wafer, semiconductor devices of quality are manufactured in high yields.

In a still further aspect, the invention provides a semiconductor device obtained by heat curing the flame retardant resin film to form a heat cured film, covering a semiconductor wafer with the heat cured film, and singulating the molded semiconductor wafer into discrete devices. The semiconductor device having the heat cured film is obtained.

The semiconductor wafer covered with the heat cured film obtained by heat curing the flame retardant resin film experiences minimal warpage while it is fully protected. By singulating the wafer, semiconductor devices of quality and without warpage are manufactured.

ADVANTAGEOUS EFFECTS OF INVENTION

Since the flame retardant resin composition can be formed into a film, it possesses satisfactory covering or encapsulating performance to large size/thin wafers. An overall wafer can be encapsulated with the resin film at a time while the resin film ensures satisfactory adhesion, low warpage, and wafer protection. The flame retardant resin film is thus useful in wafer-level packages. With the semiconductor device configuration and manufacturing method, semiconductor devices of quality are manufactured in high yields.

DESCRIPTION OF PREFERRED EMBODIMENTS

As discussed above, it is desired to develop a flame retardant wafer molding material which can encapsulate an overall wafer in a batch without raising problems including short filling at the wafer surface, and which exhibits tight adhesion, minimal warpage and satisfactory wafer protection after molding.

The inventors have found that a resin composition having improved adhesion to wafer, minimal warpage after curing and flame retardance is obtainable by combining (A) a silicone resin with (B) a phenol compound of specific structure; that the resin composition is further improved in wafer protection, reliability after curing, and flame retardance by adding (C) a filler thereto; and that a flame retardant resin film formed of the flame retardant resin composition is an effective wafer molding material having both adhesion to wafer and wafer protection.

Below, the flame retardant resin composition, resin film (composite film), semiconductor device, and manufacture of semiconductor device according to the invention are described in detail.

Briefly stated, the invention provides a flame retardant resin composition comprising (A) a silicone resin, (B) a triazine-modified phenol novolak compound, and (C) a filler.

Resin Composition

[(A) Silicone Resin]

A silicone resin serving as component (A) in the resin composition has a film forming ability. A resin film is formed from the resin composition. When used as wafer molding material, the resin film offers adhesion to wafer, minimal warpage and good molding performance.

The silicone resin (A) is defined as comprising constitutional units represented by the compositional formula (1) and having a weight average molecular weight of 3,000 to 500,000.

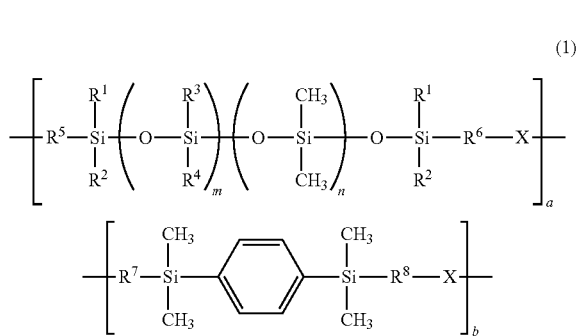

(1)

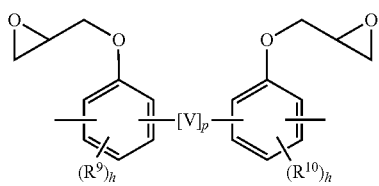

(2)

Herein $R^1$ to $R^4$ are each independently a monovalent $C_1$-$C_8$ hydrocarbon group, excluding that $R^3$ and $R^4$ are methyl at the same time, m and n each are an integer of 0 to 300, $R^5$ to $R^8$ are each independently a divalent $C_1$-$C_{10}$ hydrocarbon group, a and b are positive numbers, a+b=1. X is a divalent organic group having the general formula (2).

Herein V is a divalent organic group selected from the following:

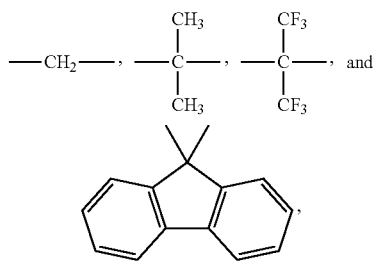

p is 0 or 1, $R^9$ and $R^{10}$ are each independently $C_1$-$C_4$ alkyl or alkoxy, and h is 0, 1 or 2.

The silicone resin comprises recurring units represented by formula (1) and has a weight average molecular weight (Mw) of 3,000 to 500,000, preferably 5,000 to 200,000, as measured versus polystyrene standards by gel permeation chromatography (GPC) using tetrahydrofuran eluent. The subscripts a and b are positive numbers, a+b=1. The units may be arranged either randomly or blockwise.

In formula (1), m and n are each independently an integer of 0 to 300, preferably m is 0 to 200, more preferably 0 to 100, and n is 1 to 200, more preferably 5 to 100. X is a divalent organic group having formula (2). $R^1$ to $R^4$ are each independently a monovalent hydrocarbon group of 1 to 8 carbon atoms, preferably 1 to 6 carbon atoms. Suitable hydrocarbon groups include alkyl, cycloalkyl and aryl groups, such as methyl, ethyl, propyl, hexyl, cyclohexyl and phenyl. Inter alia, methyl and phenyl are preferred because of availability of reactants. It is excluded that $R^3$ and $R^4$ are methyl at the same time.

In formula (2), $R^9$ and $R^{10}$ are each independently an alkyl or alkoxy group of 1 to 4 carbon atoms, preferably 1 to 2 carbon atoms, such as methyl, ethyl, propyl, tert-butyl, methoxy or ethoxy, and h is 0, 1 or 2, preferably 0.

In formula (2), V is a divalent organic group selected from the following, and p is 0 or 1.

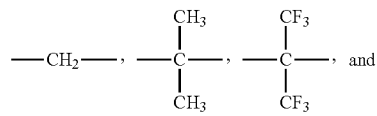

The subscripts a and b are positive numbers, a+b=1; preferably 0.05≤a≤0.80, more preferably 0.10≤a≤0.70, and 0.20≤b≤0.95, more preferably 0.30≤b≤0.90.

[Preparation of Silicone Resin (A)]

The silicone resin may be prepared by effecting addition polymerization of compounds having the general formulae (3) to (6) in the presence of a metal catalyst.

(3)

(4)

Herein $R^1$ to $R^4$ are each independently a monovalent $C_1$-$C_8$ hydrocarbon group, excluding that $R^3$ and $R^4$ are methyl at the same time, m and n each are an integer of 0 to 300.

(5)

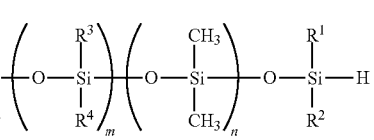

Herein V is a divalent organic group selected from the following:

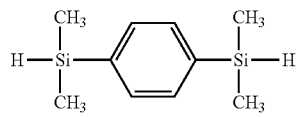

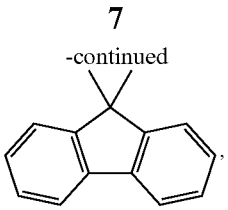

p is 0 or 1, $R^9$ and $R^{10}$ are each independently $C_1$-$C_4$ alkyl or alkoxy, h is 0, 1 or 2, $R^{11}$ is hydrogen or methyl, and g is an integer of 0 to 7.

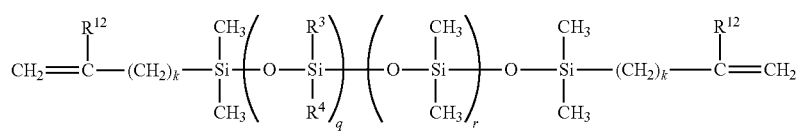

(6)

Herein $R^3$ and $R^4$ are each independently a monovalent $C_1$-$C_8$ hydrocarbon group, excluding that $R^3$ and $R^4$ are methyl at the same time, q and r each are an integer of 0 to 300, $R^{12}$ is hydrogen or methyl, and k is an integer of 0 to 7.

The metal catalyst used herein is typically a platinum group metal base catalyst. Exemplary catalysts include elemental platinum group metals such as platinum (inclusive of platinum black), rhodium and palladium; platinum chloride, chloroplatinic acid and chloroplatinic acid salts such as $H_2PtCl_4.xH_2O$, $H_2PtCl_6.xH_2O$, $NaHPtCl_6.xH_2O$, $KHPtCl_6.xH_2O$, $Na_2PtCl_6.xH_2O$, $K_2PtCl_4.xH_2O$, $PtCl_4.xH_2O$, $PtCl_2$ and $Na_2HPtCl_4.xH_2O$ wherein x is an integer of 0 to 6, preferably 0 or 6; alcohol-modified chloroplatinic acid (see U.S. Pat. No. 3,220,972); complexes of chloroplatinic acid with olefins (see U.S. Pat. Nos. 3,159,601, 3,159,662 and 3,775,452); platinum group metals such as platinum black and palladium on carriers such as alumina, silica and carbon; rhodium-olefin complexes; chlorotris(triphenylphosphine)rhodium (known as Wilkinson catalyst); and complexes of platinum chloride, chloroplatinic acid or chloroplatinic acid salts with vinyl-containing siloxanes, especially vinyl-containing cyclic siloxanes.

The catalyst is used in a catalytic amount, typically 0.0001 to 0.1%, preferably 0.001 to 0.01% by weight of platinum group metal based on the total weight of reactants. Although addition reaction may run even in a solventless system, a solvent may be used if desired. The solvent, if used, is preferably selected from hydrocarbon solvents such as toluene and xylene. The reaction temperature is not particularly limited as long as the catalyst is not deactivated and polymerization is complete within an acceptable time. For example, an appropriate temperature is 40 to 150° C., especially 60 to 120° C. The reaction time may be selected depending on the type and amount of reactants, and is preferably 0.5 to 100 hours, more preferably 0.5 to 30 hours. When the solvent is used, vacuum distillation is carried out at the end of reaction to distill off the solvent.

The reaction procedure is not particularly limited. When compounds of formulae (3), (4), (5), and (6) are reacted, one exemplary procedure is by premixing the compounds of formulae (5) and (6), heating the mixture, adding a metal catalyst to the mixture, and adding dropwise the compounds of formulae (3) and (4) over 0.1 to 5 hours.

Preferably the compounds of formulae (3), (4), (5), and (6) are blended such that the ratio of the total moles of hydrosilyl groups in the compounds of formulae (3) and (4) to the total moles of alkenyl groups in the compounds of formulae (5) and (6) may range from 0.67 to 1.67, more preferably from 0.83 to 1.25. The Mw of the polymer may be controlled by using a molecular weight modifier such as a monoallyl compound (e.g., o-allylphenol), monohydrosilane (e.g., triethylhydrosilane) or monohydrosiloxane.

It is preferred from the aspects of film forming ability, molding performance, and low warpage that the silicone resin have a siloxane content of 30 to 80% by weight.

[(B) Triazine Skeleton-bearing Phenol Novolak Compound]

Component (B) is a triazine skeleton-bearing phenol novolak compound, which is obtained from condensation of a phenol, an aldehyde, and an amino-containing triazine compound. Examples of the phenol include phenol; alkylphenols such as o-cresol, m-cresol, xylenol, ethylphenol, butylphenol, nonylphenol, and octylphenol; polyhydric phenols such as bisphenol A, bisphenol F, bisphenol S, bisphenol AD, tetramethylbisphenol A, resorcinol, and catechol; naphthols such as monohydroxynaphthalene and dihydroxynaphthalene; phenylphenol and aminophenol. Such phenols are condensed with aldehydes to form novolak resins, with cresol novolak resins being preferred.

Further, the novolak resin is condensed with a triazine to form a triazine skeleton-bearing phenol compound. Specifically, the triazine skeleton-bearing phenol compound has the general formula (7).

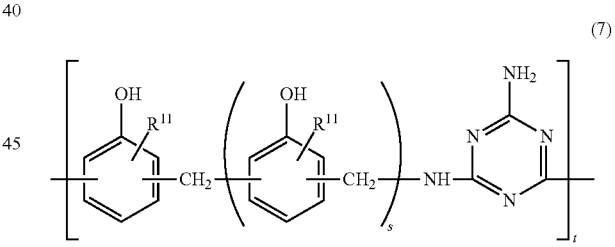

(7)

Herein $R^{11}$ is hydrogen or methyl, preferably methyl, s is an integer of 1 to 10, and t is an integer of 1 to 5.

As the triazine skeleton-bearing phenol resin, use may be made of Phenolite LA series commercially available from DIC Corp. As the triazine skeleton-bearing phenol resin, those resins containing 5 to 24% by weight of triazine skeleton and having a nitrogen content of 5 to 25% by weight, more preferably 8 to 20% by weight and a hydroxyl equivalent of 100 to 160, more preferably 120 to 150 may be used. From the standpoint of flame retardance, those resins having a nitrogen content of 10 to 20% by weight are more desirable.

Component (B) is to incur crosslinking reaction with the silicone resin (A) when heated. The addition of component (B) is effective for improving the adhesion to wafer, protection, reliability and flame retardance of the silicone resin. The phenol compounds may be used alone or in admixture.

Although the amount of the triazine skeleton-bearing phenol compound used is not particularly limited, the amount is preferably 5 to 50 parts by weight, more preferably 5 to 40 parts by weight per 100 parts by weight of component (A). As long as the amount of the triazine skeleton-bearing phenol compound used is in the range, the composition is further improved in adhesion, protection, and flame retardance and the cured product thereof is more reliable.

[(C) Filler]

Component (C) is a filler for imparting wafer protection to the resin composition, improving its heat resistance, moisture resistance and strength, and enhancing its reliability and flame retardance. Suitable fillers include silicic acid salts such as talc, calcined clay, non-calcined clay, mica and glass; oxides such as titanium oxide, alumina, fused silica (e.g., fused spherical silica and fused ground silica), and crystalline silica powder; carbonates such as calcium carbonate, magnesium carbonate and hydrotalcite; hydroxides such as aluminum hydroxide, magnesium hydroxide, and calcium hydroxide; sulfates and sulfites such as barium sulfate, calcium sulfate, and calcium sulfite; boric acid salts such as zinc borate, barium metaborate, aluminum borate, calcium borate, and sodium borate; and nitrides such as aluminum nitride, boron nitride, and silicon nitride. The fillers may be used alone or in admixture. Inter alia, powdered silica such as fused silica or crystalline silica is preferred. Examples of the powdered silica include reinforcing silica such as fumed silica or precipitated silica, and crystalline silica such as quartz. These silica species are commercially available, for example, under the trade name of Aerosil R972, R974, and R976 from Nippon Aerosil Co., Ltd., SE-2050, SC-2050, SE-1050, SO-E1, SO-C1, SO-E2, SO-C2, SO-E3, SO-C3, SO-E5, and SO-05 from Admatechs, and Musil 120A and Musil 130A from Shin-Etsu Chemical Co., Ltd.

The filler in particulate form preferably has an average particle size of 0.01 to 20 μm, more preferably 0.01 to 10 μm, although the particle size is not limited thereto. An inorganic filler with an average particle size beyond the lower limit is unlikely to agglomerate and effective to impart strength. An inorganic filler with an average particle size below the upper limit allows the resin to flow between chips and achieves dense filling. The average particle size is measured by a particle size distribution measuring instrument based on the laser diffraction method, as a weight average value, that is, weight basis 50% cumulative particle diameter ($D_{50}$) or median diameter.

The filler is preferably used in an amount of 60 to 95% by weight, more preferably 70 to 90% by weight based on the total weight of the flame retardant resin composition. An amount of the filler below the upper limit ensures a film forming ability, smooth resin flow and dense filling. An amount of the filler above the lower limit is fully effective.

Epoxy Resin

To the flame retardant resin composition, an epoxy resin may be added for the purpose of improving adhesion to wafer and protection. Like the silicone resin (A), the epoxy resin undergoes crosslinking reaction with the phenol compound (B) for thereby improving adhesion to wafer, protection, and reliability.

Examples of the epoxy resin include bisphenol A epoxy resins, bisphenol F epoxy resins, hydrogenated products thereof, glycidyl ether based epoxy resins such as phenol novolak type epoxy resins and cresol novolak type epoxy resins, glycidyl ester based epoxy resins such as glycidyl hexahydrophthalate and dimer acid glycidyl esters, triglycidyl isocyanurate, and glycidyl amine based epoxy resins such as tetraglycidyl diaminodiphenylmethane. Inter alia, bisphenol A epoxy resins, bisphenol F epoxy resins, phenol novolak type epoxy resins, and cresol novolak type epoxy resins are preferred. Epoxy resins with more aromatic carbon contents are more preferred for flame retardance. These resins are commercially available, for example, under the trade name of jER 1001 and jER 517 from Mitsubishi Chemical Co., Ltd., Epiclon 830S from DIC Corp., and EOCN 103S from Nippon Kayaku Co., Ltd.

If used, the epoxy resin is preferably added in an amount of 1 to 50 parts, more preferably 2 to 30 parts by weight per 100 parts by weight of component (A).

Epoxy Resin Cure Accelerator

The flame retardant resin composition may further contain an epoxy resin cure accelerator. The cure accelerator is effective for adequate and uniform progress of curing reaction. The amount of the cure accelerator used may be 0.1 to 10 parts, preferably 0.2 to 5 parts by weight per 100 parts by weight of component (A).

Examples of the epoxy resin cure accelerator include imidazole compounds such as 2-methylimidazole, 2-ethylimidazole, 2-ethyl-4-methylimidazole, ethylisocyanates of the foregoing, 2-phenylimidazole, 2-phenyl-4-methylimidazole, 2-phenyl-4-methyl-5-hydroxymethylimidazole, and 2-phenyl-4,5-dihydroxymethylimidazole; DBU compounds such as 1,8-diazabicyclo(5.4.0)undecane-7 (DBU), 1,5-diazabicyclo(4.3.0)nonene-5 (DBN), organic acid salts of DBU, phenolic resin salts of DBU, and tetraphenylborate salts of DBU derivatives; triorganophosphines such as triphenylphosphine, tributylphosphine, tris(p-methylphenyl)phosphine, tris(p-methoxyphenyl)phosphine, tris(p-ethoxyphenyl)phosphine, triphenylphosphine-triphenylborate, and tetraphenylphosphine-tetraphenylborate; quaternary phosphonium salts, tertiary amines such as triethyleneammonium-triphenylborate, and tetraphenylboric acid salts thereof. The cure accelerators may be used alone or in admixture.

Silane Coupling Agent

The flame retardant resin composition may further comprise a silane coupling agent which is effective for improving the adhesion of the resin composition to wafer. Suitable silane coupling agents include epoxy silane coupling agents and aromatic amino silane coupling agents, which may be used alone or in admixture. If used, the silane coupling agent is preferably added in an amount of 0.01 to 5% by weight based on the total weight of the resin composition.

Another component may be added to the flame retardant resin composition. For example, additives may be added for improving the compatibility between silicone resin (A) and triazine skeleton-bearing phenol compound (B), or enhancing the storage stability, workability and other properties of the resin composition. Suitable additives include internal parting agents such as fatty acid esters, glycerates, zinc stearate, and calcium stearate, and antioxidants such as phenol, phosphorus or sulfur-based antioxidants. Optional additives may be added as such to the flame retardant resin composition. Alternatively, an additive may be dissolved or dispersed in an organic solvent to form a solution or dispersion, which is then added to the resin composition.

Organic Solvent

Optionally, an organic solvent may be used to form a dispersion of the flame retardant resin composition. Suitable organic solvents include N,N-dimethylacetamide, methyl ethyl ketone, N,N-dimethylformamide, cyclohexanone, cyclopentanone, N-methyl-2-pyrrolidone, toluene, methanol, ethanol, isopropanol, acetone, propylene glycol monomethyl ether, and propylene glycol monomethyl ether acetate (PGMEA). Inter alia, methyl ethyl ketone, cyclopentanone, propylene glycol monomethyl ether, and PGMEA are preferred. The organic solvents may be used alone or in admixture. Preferably the organic solvent is used in such an amount that the resin composition dispersion may have a solid concentration of 50 to 80% by weight.

Resin Film

Preferably the flame retardant resin composition is preformed into a film. The resin film has good molding ability to large-diameter/thin wafers, and eliminates a need to cast the resin composition when a wafer is encapsulated in a batch. This essentially solves the outstanding problems in the prior art including wire deformation and short filling at wafer surface in the case of transfer molding, difficult control of the molding range in the case of compression molding, and fluidity and physical properties of liquid encapsulant resins.

The thickness of the flame retardant resin film is preferably 50 μm to 1,000 μm, more preferably 80 μm to 700 μm, but not limited thereto. A resin film with a thickness in the range has the advantages of minimal warpage and good protection.

In this sense, the invention provides a flame retardant resin film formed from the flame retardant resin composition. Embodiments of the flame retardant resin film include a resin film formed from the flame retardant resin composition, and a protected resin film consisting of a flame retardant resin film and a protective layer covering the resin film. The protective layer will be described later. It is now described how to prepare the flame retardant resin film.

Preparation of Flame Retardant Resin Film

First, a flame retardant resin composition in liquid form, i.e., resin composition solution is prepared by mixing silicone resin (A), triazine skeleton-bearing phenol compound (B), filler (C), and optional components in an organic solvent. Using a reverse roll coater, comma coater or the like, the resin composition solution is coated onto a protective layer (protective film or release film). The protective layer coated with the resin composition solution is passed through an in-line dryer where it is dried at 80 to 160° C. for 2 to 20 minutes to remove the organic solvent. Using a roll laminator, the coated protective layer is pressure bonded to another protective layer into a laminate, that is, a film precursor including a flame retardant resin film (or layer) according to the invention. The pressure bonding conditions for lamination include a temperature of 50 to 100° C., a linear pressure of 0.5 to 5 kgf/cm, and a speed of 0.1 to 5 m/min, but are not limited thereto.

In another embodiment, at least two such film precursors (protective layer/resin layer/protective layer) are furnished, the protective layer is stripped from each precursor to bare the flame retardant resin composition layer, the bare resin composition layers of the film precursors are joined to each other, yielding a (composite) resin film consisting of two resin layers. In the joining step, preferably the resin layers are bonded while heating at 30 to 120° C.

Protective Layer (Protective or Release Film)

The protective layer used herein is not particularly limited as long as it can be stripped from the film precursor without adversely affecting the resin layer. The protective layer serves as a protective film or release film for wafers. Included are plastic films such as polyethylene (PE) film, polypropylene (PP) film, polymethylpentene (TPX) film, and polyester film treated with a parting agent. Typically the protective layer requires a release force of 50 to 300 mN/min and has a thickness of 25 to 150 μm, preferably 38 to 125 μm.

Wafer

The wafer to be covered with the resin film in a batch is not particularly limited, and it may be a wafer having semiconductor devices or chips mounted thereon or a semiconductor wafer having semiconductor devices built in its surface. The resin film has a good filling ability relative to the wafer surface prior to molding and offers minimal warpage and good protection after molding. The resin film is advantageously applicable to large-diameter wafers having a diameter of at least 8 inches, typically 8 inches (200 mm) or 12 inches (300 mm), or a larger diameter of 450 mm, and thin wafers which have been thinned to a thickness of 5 to 300 μm, although the wafer is not limited thereto.

Coverage of Wafer

The method for covering or encapsulating a wafer with the flame retardant resin film of the invention is not particularly limited. For example, one protective layer (in the laminate of resin film sandwiched between protective layers) is stripped off. Using a vacuum laminator (e.g., model TEAM-300 by Takatori Corp.) whose vacuum chamber is set at a vacuum of 50 to 1,000 Pa, preferably 50 to 500 Pa, typically 100 Pa, and a temperature of 80 to 200° C., preferably 80 to 130° C., typically 100° C., the bare resin film on the other protective layer is attached to a wafer in a batch. After restoration of atmospheric pressure, the wafer is cooled to room temperature and taken out of the laminator, and the other protective layer was stripped off.

Also, for a wafer having semiconductor chips mounted thereon, a compression molding machine or a system including a vacuum diaphragm laminator and a metal platen press for flattening may be used. A typical compression molding machine is model MZ-824-01 by Apic Yamada Corp. A 300-mm silicon wafer having semiconductor chips mounted thereon may be encapsulated (or molded) under conditions including a temperature of 100 to 180° C., a molding pressure of 100 to 300 kN, a clamp time of 30 to 90 seconds, and a molding time of 5 to 20 minutes.

A typical system including a vacuum diaphragm laminator and a metal platen press for flattening is model CVP-300 by Nikko-Materials Co., Ltd. Lamination may be performed under conditions including a temperature of 100 to 180° C., a vacuum of 50 to 500 Pa, a pressure of 0.1 to 0.9 PMa, and a time of 30 to 300 seconds, and the top of the laminated resin be flattened under conditions including an upper/lower platen temperature of 100 to 180° C., a pressure of 0.1 to 3.0 MPa, and a pressing time of 30 to 300 seconds.

After molding or coverage, the resin film is heated at 120 to 220° C. for 15 to 180 minutes for curing the resin film.

Semiconductor Device

The semiconductor wafer covered with the resin film in the heat cured state is then diced (singulation) into discrete semiconductor devices (each having a cured resin film). Specifically, the resin film-covered wafer (also referred to as molded wafer) is attached to a semiconductor processing protective tape (such as dicing tape), with the resin film or wafer in contact with the tape, and rested on a chuck table of a dicer, before it is diced by means of a dicing saw with a dicing blade (e.g., DFD6361 by DISCO Corp.). Although the spindle revolution and cutting speed of dicing operation may vary over a wide range, appropriate dicing conditions include a spindle revolution of 25,000 to 45,000 rpm and a cutting speed of 10 to 50 mm/sec. Discrete units are generally dimensioned from 2 mm×2 mm to 30 mm×30 mm, although the dimensions depend on a particular semiconductor package design.

Now that the wafer which is minimized in warpage and fully protected with the resin film is singulated using a dicing blade, for example, discrete semiconductor devices of quality are obtained in high yields.

Manufacture of Semiconductor Device

The method for manufacturing semiconductor devices starts with the laminate of resin film sandwiched between protective layers, and involves the steps of peeling one protective layer from the laminate to bare the resin film, attaching the bare resin film to a semiconductor wafer, and peeling the other protective layer from the resin film, for thereby covering the semiconductor wafer with the resin film, and singulating the covered semiconductor wafer into discrete pieces.

EXAMPLE

Synthesis Examples, Examples and Comparative Examples are given below by way of illustration and not by way of limitation.

In Synthesis Examples, the weight average molecular weight (Mw) of a polymer was measured by gel permeation chromatography (GPC) versus monodisperse polystyrene standards, using GPC column TSKgel Super HZM-H (Tosoh Corp.) under conditions including tetrahydrofuran eluent, flow rate 0.6 mL/min and column temperature 40° C.

The compounds used in Synthesis Examples are identified below.

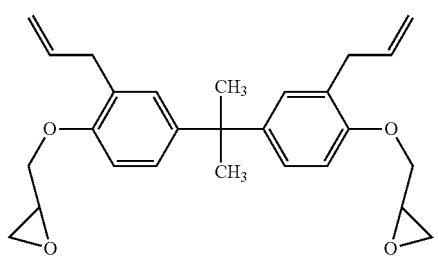
(S-1)

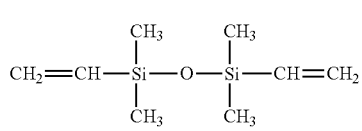
(S-2)

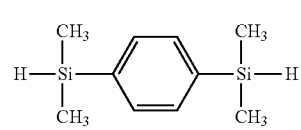
(S-3)

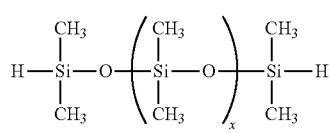
(S-4)

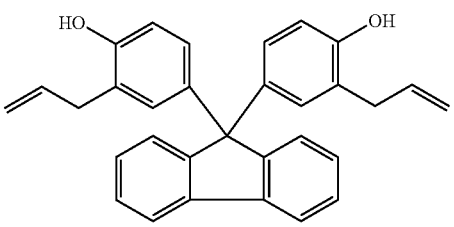
(S-5)

Note that Compounds S-2, S-3 and S-4 are commercially available from Shin-Etsu Chemical Co., Ltd.

Synthesis Example 1

A 3-L flask equipped with a stirrer, thermometer, nitrogen purging line and reflux condenser was charged with 147 g (0.35 mol) of Compound S-1 and 27.9 g (0.15 mol) of Compound S-2, to which 2,000 g of toluene was added. The flask was heated at 70° C., after which 1.0 g of a toluene solution of chloroplatinic acid (Pt concentration 0.5 wt %) was admitted, and 77.8 g (0.4 mol) of Compound S-3 and 276.7 g (0.1 mol) of Compound S-4 wherein x=40 were added dropwise over 1 hour. This resulted in a ratio of (total moles of hydrosilyl groups)/(total moles of alkenyl groups)=1/1. At the end of dropwise addition, the reaction solution was heated at 100° C. and ripened for 6 hours. Toluene was distilled off in vacuum from the reaction solution, yielding a product having a Mw of 45,000. The product is designated Resin #1. It is noted that Resin #1 had a siloxane content of 58 wt % and consisted of constitutional units in a ratio: a=0.2 and b=0.8 in accordance with the charges.

Synthesis Example 2

A 3-L flask equipped with a stirrer, thermometer, nitrogen purging line and reflux condenser was charged with 210 g (0.5 mol) of Compound S-1, to which 2,100 g of toluene was added. The flask was heated at 70° C., after which 1.0 g of a toluene solution of chloroplatinic acid (Pt concentration 0.5 wt %) was admitted, and 77.8 g (0.4 mol) of Compound S-3 and 361.9 g (0.1 mol) of Compound S-4 wherein x=100 were added dropwise over 1 hour. This resulted in a ratio of (total moles of hydrosilyl groups)/(total moles of alkenyl groups)=1/1. At the end of dropwise addition, the reaction solution was heated at 100° C. and ripened for 6 hours. Toluene was distilled off in vacuum from the reaction solution, yielding a product having a Mw of 48,000. The product is designated Resin #2. It is noted that Resin #2 had a siloxane content of 69 wt % and consisted of constitutional units in a ratio: a=0.2 and b=0.8 in accordance with the charges.

Synthesis Example 3

A 3-L flask equipped with a stirrer, thermometer, nitrogen purging line and reflux condenser was charged with 105 g (0.25 mol) of Compound S-1 and 46.5 q (0.25 mol) of Compound S-2, to which 1,000 g of toluene was added. The flask was heated at 70° C., after which 0.5 g of a toluene solution of chloroplatinic acid (Pt concentration 0.5 wt %) was admitted, and 77.8 g (0.40 mol) of Compound S-3 and 70.6 g (0.10 mol) of Compound S-4 wherein x=8 were added dropwise over 1 hour. This resulted in a ratio of (total moles of hydrosilyl groups)/(total moles of alkenyl groups)=1/1. At the end of dropwise addition, the reaction solution was heated at 100° C. and ripened for 6 hours. Toluene was distilled off in vacuum from the reaction solution, yielding a product having a Mw of 35,000. The product is designated Resin #3. It is noted that Resin #3 had a siloxane content of 39 wt % and consisted of constitutional units in a ratio: a=0.2 and b=0.8 in accordance with the charges.

Comparative Synthesis Example 1

A 3-L flask equipped with a stirrer, thermometer, nitrogen purging line and reflux condenser was charged with 151 g (0.35 mol) of Compound S-5 and 27.9 g (0.15 mol) of Compound S-2, to which 2,000 g of toluene was added. The flask was heated at 70° C., after which 1.0 g of a toluene solution of chloroplatinic acid (Pt concentration 0.5 wt %) was admitted, and 77.8 g (0.4 mol) of Compound S-3 and 276.7 g (0.1 mol) of Compound S-4 wherein x=40 were added dropwise over 1 hour. This resulted in a ratio of (total moles of hydrosilyl groups)/(total moles of alkenyl groups) =1/1. At the end of dropwise addition, the reaction solution was heated at 100° C. and ripened for 6 hours. Toluene was distilled off in vacuum from the reaction solution, yielding a product having a Mw of 38,000. The product is designated Resin #4, which was used in Comparative Example 1. It is noted that Resin #4 had a siloxane content of 57 wt %.

Examples 1 to 6 & Comparative Examples 1 to 4

[Preparation of Flame Retardant Resin Composition]

A resin composition in liquid dispersion form was prepared by mixing silicone resin (A) (Resin #1, #2 or #3), triazine-bearing phenol compound (B), filler (C), and optional components in accordance with the formulation shown in Table 1, adding cyclopentanone to the mixture so as to give a solid concentration of 65 wt %, agitating and milling the mixture in a ball mill for dissolution and dispersion. Notably, the amount of components in Table 1 is expressed in parts by weight.

Comparative Example 1 is a resin composition containing a silicone resin (Resin #4) outside the scope of the inventive silicone resin (A). Comparative Example 2 is a resin composition containing a phenol novolak resin outside the scope of the inventive phenol compound (B). Comparative Example 3 is a resin composition which is free of filler (C).

[Formation of Resin Film]

Using a die coater as the film coater, the flame retardant resin composition of Example 1 in Table 1 was coated onto a release film which was Release film #1 of E7304. This was passed through a hot-air circulating oven of 4 m long set at 100° C. over 5 minutes, forming a resin layer of 100 μm thick on Release film #1. Using a roll laminator, a protective film which was a polyethylene film of 100 μm thick was joined and bonded to the resin layer at 100° C. and a linear pressure of 10 N/cm, yielding a first laminate of Release film #1/resin layer/protective film.

The above procedure was repeated aside from using Release film #2 of E7302 instead of Release film #1. There was obtained a second laminate of Release film #2/resin layer/protective film.

Next, the protective films (PE films) were stripped from the first and second laminates. The laminates with their bare resin layers mated together were passed through a hot roll laminator at 60° C. to form an integral laminate consisting of Release film #1/resin film/Release film #2 wherein the resin film (consisting of two resin layers) had a thickness of 200 μm.

The procedure of Example 1 was repeated using each of the remaining resin compositions in Table 1, yielding integral laminates having a resin film of 200 μm thick. In Example 6, an integral laminate having a resin film of 500 μm thick was similarly obtained.

The components used in the preparation of resin compositions are identified below.

Triazine Skeleton-bearing Phenol Compound (B)
  Phenolite LA-7054
    (triazine skeleton-bearing cresol novolak, nitrogen content 12 wt %, OH equivalent 125, by DIC Corp.)
  Phenolite LA-7751
    (triazine skeleton-bearing cresol novolak, nitrogen content 14 wt %, OH equivalent 135, by DIC Corp.)
  Phenolite LA-1356
    (triazine skeleton-bearing cresol novolak, nitrogen content 19 wt %, OH equivalent 146, by DIC Corp.)
Filler (C)
  Silica with average particle size 5.0 μm (Admatechs)
Other Components
  EOCN-103S
    (epoxy resin, epoxy equivalent 209-219, Nippon Kayaku Co., Ltd.)
  Curesol 2P4MHZ
    (2-phenyl-4-methyl-5-hydroxymethylimidazole by Shikoku Chemicals Corp.)
  Phenolite TD-2090
    (triazine skeleton-free novolak type phenol resin, OH equivalent 105, by DIC Corp.)
  Melamine
    (amine equivalent 42, nitrogen content 66.6 wt % by Wako Pure Chemical Industries, Ltd.)
Release film #1: E7304
  (polyester, thickness 75 μm, release force 200 mN/50 mm, Toyobo Co., Ltd.)
Release film #2: E7302
  (polyester, thickness 75 μm, release force 90 mN/50 mm, Toyobo Co., Ltd.)
Protective film: polyethylene film of 100 μm thick

TABLE 1

| Component (pbw) | | Example 1 | 2 | 3 | 4 | 5 | 6 | Comparative Example 1 | 2 | 3 | 4 |
|---|---|---|---|---|---|---|---|---|---|---|---|
| (A) Silicone resin | Resin #1 | 100 | 100 | 100 | | | 100 | | 100 | 100 | 100 |
| | Resin #2 | | | | 100 | | | | | | |
| | Resin #3 | | | | | 100 | | | | | |
| Silicone resin outside | Resin #4 | | | | | | | 100 | | | |
| (B) Phenol compound | LA-7054 | 17 | | | 10 | | 22 | | | | |
| | LA-7751 | | 18 | | | 30 | | | | 16 | |
| | LA-1356 | | | 19 | | | | | | | |

TABLE 1-continued

| Component (pbw) | | Example 1 | 2 | 3 | 4 | 5 | 6 | Comparative Example 1 | 2 | 3 | 4 |
|---|---|---|---|---|---|---|---|---|---|---|---|
| Phenol compound outside | TD-2090 | | | | | | | 14 | | | |
| Triazine-bearing compound | Melamine | | | | | | | | | | 10 |
| (C) Filler | Silica | 500 | 500 | 500 | 500 | 500 | 500 | 500 | 500 | | 500 |
| Others | EOCN-1035 | | | | | | 10 | 28 | | | |
| | Curesol 2P4MHZ | 1 | 1 | 1 | 1 | 1 | 1 | 1 | 1 | 1 | 1 |
| Resin film thickness (μm) | | 200 | 200 | 200 | 200 | 200 | 500 | 200 | 200 | 200 | 200 |

[Coverage of Wafer with Resin Film]

There were furnished silicon wafers having a diameter of 12 inches (300 mm) and a thickness of 100 μm. Release film #2 was stripped from each of the integral laminates of Examples 1 to 6 and Comparative Examples 1 to 4. Using a vacuum laminator model TEAM-300M (Takatori Corp.) whose vacuum chamber was set at a vacuum of 250 Pa, the bare resin film was attached to the silicon wafer in a batch at a temperature of 110° C. After restoration of atmospheric pressure, the silicon wafer was cooled to 25° C. and taken out of the laminator. Release film #1 was stripped off. There was left the resin film-covered wafer, which was heated in an inert oven at 180° C. for 2 hours for curing the resin.

Test 1: Wafer Warpage

The wafer covered with the cured resin film was measured for warpage by a laser instrument FLX-3300-T (Toho Technology Co., Ltd.). The results are shown in Table 2. For those samples whose warpage was too large to measure by the instrument, warpage was measured by a ruler (JIS Grade 1).

Test 2: Wafer Supportability

While the resin film-covered wafer was supported at an edge, the wafer was measured for deflection by a ruler (JIS Grade 1). Wafer supportability is rated good when the deflection is within 20 mm and poor when the deflection exceeds 20 mm. The results are shown in Table 2.

Test 3: Adhesion

Using a vacuum laminator model TEAM-100 (Takatori Corp.), a resin film of 25 μm thick was attached and bonded to a semiconductor wafer (diameter 6 inches, thickness 625 μm, by Shin-Etsu Chemical Co., Ltd.) at a pressure of 100 Pa and a temperature of 100° C. Using an automatic dicing saw with a dicing blade (DAD685 by DISCO Corp.), the wafer was diced into square pieces of 2 mm×2 mm. There was separately furnished a silicon wafer (base substrate) of 15 mm×15 mm. A square chip of 2 mm×2 mm with its resin film faced down was placed on the silicon wafer and bonded thereto at 150° C. under a load of 50 mN. The assembly was heated at 180° C. for 2 hours to cure the resin film. In this way, five test samples were prepared for each Example and subjected to the following bond strength test.

A bond tester (Dage series 4000-PXY by Dage) was used. In an attempt to peel the semiconductor chip (2 mm×2 mm) from the base substrate (silicon wafer of 15 mm×15 mm), a resisting force was measured and reported as the adhesion or bond strength of the resin film. The test conditions included a speed of 200 μm/sec and a height of 50 μm. The results are shown in Table 2. The value in Table 2 is an average of measurements of five test samples, and a higher value indicates a higher bond strength of the resin film (i.e., bonding sheet).

Test 4: Reliability

By operating a dicing saw with a dicing blade (DAD685 by DISCO Corp.) at a spindle revolution of 40,000 rpm and a cutting speed of 20 mm/sec, the wafer covered with the cured resin film was diced into square pieces (test samples) of 10 mm×10 mm. Ten test samples (for each Example) were subjected to a thermal cycling test of repeating 1,000 cycles of holding at −25° C. for 10 minutes and holding at 125° C. for 10 minutes. After the thermal cycling test, it was inspected by ultrasonic detection whether or not the resin film peeled from the wafer. The judgment is good when peel is observed in none of the samples, and poor when peel is observed in one or more samples. The results are shown in Table 2.

Test 5: Flame Retardance

From each of the integral laminates of Examples 1 to 6 and Comparative Examples 1 to 4, Release film #2 was stripped off. The resin film was heated in an inert oven at 180° C. for 2 hours for curing the resin. The cured film was evaluated for flame retardance by the UL94 flame retardance test. The sample is rated good when its flame retardance clears UL94 V-0 rating and poor when its flame retardance fails to clear UL94 V-0 rating. The results are shown in Table 2.

TABLE 2

| Test item | Example 1 | 2 | 3 | 4 | 5 | 6 | Comparative Example 1 | 2 | 3 | 4 |
|---|---|---|---|---|---|---|---|---|---|---|
| Wafer warpage (mm) | <1 | <1 | <1 | <1 | <1 | <1 | 45 | <1 | <1 | 33 |
| Wafer supportability | good | good | good | good | good | good | good | good | poor | good |
| Adhesion (MPa) | 27.0 | 28.9 | 28.6 | 27.9 | 27.5 | 30.1 | 27.4 | 25.4 | 22.1 | 18.0 |
| Reliability | good | good | good | good | good | good | poor | good | poor | poor |
| Flame retardance | good | good | good | good | good | good | poor | poor | poor | good |

It is evident from the test data that the resin films of the flame retardant resin compositions of Examples offer reduced wafer warpage, good wafer supportability, adhesion, reliability and flame retardance as compared with Comparative Examples.

The flame retardant resin composition of the invention is formed into a film, with which a wafer can be covered or encapsulated in a batch. The resin film of the resin composition has satisfactory molding or covering performance to large-diameter/thin wafers. The resin film has the advantages of minimal warpage, wafer protection, adhesion, reliability, and flame retardance.

Although a particular embodiment of the invention has been described in detail for purposes of illustration, various modifications and enhancements may be made without departing from the spirit and scope of the invention. Accordingly, the invention is not to be limited except as by the appended claims.

Japanese Patent Application No. 2015-216560 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A flame retardant resin composition comprising:
   (A) a silicone resin comprising constituent units represented by the compositional formula (1) and having a weight average molecular weight of 3,000 to 500,000,

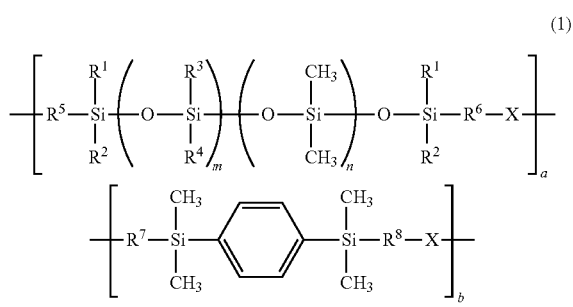

wherein $R^1$ to $R^4$ are each independently a monovalent $C_1$-$C_8$ hydrocarbon group, excluding that $R^3$ and $R^4$ are methyl at the same time, m and n each are an integer of 0 to 300, $R^5$ to $R^8$ are each independently a divalent $C_1$-$C_{10}$ hydrocarbon group, a and b are positive numbers, a+b=1, X is a divalent organic group having the general formula (2):

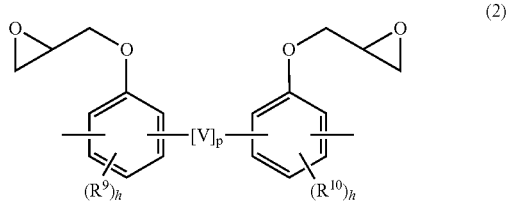

wherein V is a divalent organic group selected from the following:

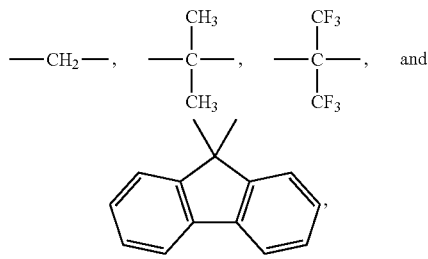

p is 0 or 1, $R^9$ and $R^{10}$ are each independently $C_1$-$C_4$ alkyl or alkoxy, and h is 0, 1 or 2,
   (B) a triazine-modified phenol novolak compound, and
   (C) a filler,
   wherein 5 to 50 parts by weight of component (B) is present per 100 parts by weight of component (A), and component (C) is present in a weight fraction of 70 to 90% by weight of the total weight of the composition.

2. The resin composition of claim 1 wherein component (B) is a triazine skeleton-bearing phenol compound having the general formula (7):

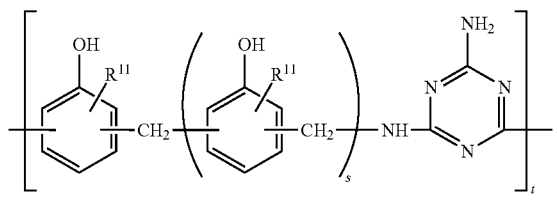

wherein $R^{11}$ is hydrogen or methyl, s is an integer of 1 to 10, and t is an integer of 1 to 5.

3. The resin composition of claim 1 further comprising an epoxy resin.

4. The resin composition of claim 1 further comprising an epoxy resin cure accelerator.

5. The resin composition of claim 1 wherein component (C) is silica.

6. A flame retardant resin film comprising the resin composition of claim 1.

7. A method for manufacturing semiconductor devices, comprising the steps of:
   attaching the flame retardant resin film of claim 6 to a semiconductor wafer to cover the wafer with the resin film,
   heat curing the resin film, and
   singulating the covered wafer into discrete devices.

8. A semiconductor device obtained from singulation of a semiconductor wafer which is covered with a film which is prepared by heat curing the flame retardant resin film of claim 6, said semiconductor device comprising the cured flame retardant resin film.

* * * * *